United States Patent
Lin et al.

(10) Patent No.: US 7,773,411 B2
(45) Date of Patent: Aug. 10, 2010

(54) PHASE CHANGE MEMORY AND CONTROL METHOD THEREOF

(75) Inventors: Lieh-Chiu Lin, Kaoshiung (TW); Shyh-Shyuan Sheu, Taichung (TW); Pei-Chia Chiang, Taipei (TW); Wen-Pin Lin, Dacun (TW)

(73) Assignee: Industrial Technology Research Institute, Hsinchu (TW)

( * ) Notice: Subject to any disclaimer, the term of this patent is extended or adjusted under 35 U.S.C. 154(b) by 100 days.

(21) Appl. No.: 12/268,581

(22) Filed: Nov. 11, 2008

(65) Prior Publication Data

US 2009/0147566 A1 Jun. 11, 2009

(30) Foreign Application Priority Data

Dec. 6, 2007 (TW) .............................. 96146499 A

(51) Int. Cl.
*G11C 11/00* (2006.01)
(52) U.S. Cl. .......................... 365/163; 365/148; 365/63
(58) Field of Classification Search ................. 365/163, 365/148, 63
See application file for complete search history.

(56) References Cited

U.S. PATENT DOCUMENTS

| 6,778,426 B2 | 8/2004 | Hosotani |
| 2006/0157679 A1* | 7/2006 | Scheuerlein .................. 257/2 |
| 2009/0027951 A1* | 1/2009 | Kau .......................... 365/163 |

* cited by examiner

*Primary Examiner*—Tuan T. Nguyen
(74) *Attorney, Agent, or Firm*—Wang Law Firm; Li K. Wang

(57) ABSTRACT

A phase change memory wherein several phase change storage elements are coupled in series to share a single current source. The current provided by the current source is directed by a plurality of switches. To write/read the phase change storage elements, the invention provides techniques to control the current value generated by the current source and controls the states of the switches. The impedance summation of the phase change storage elements vary with the data stored therein.

11 Claims, 3 Drawing Sheets

PHASE CHANGE MEMORY AND CONTROL METHOD THEREOF

CROSS REFERENCE TO RELATED APPLICATIONS

This Application claims priority of Taiwan Patent Application No. 96146499, filed on Dec. 6, 2007, the entirety of which is incorporated by reference herein.

BACKGROUND OF THE INVENTION

1. Field of the Invention

The present invention relates to phase change memories and control methods thereof.

2. Description of the Related Art

A memory composed of a plurality of phase change storage elements is named Phase Change Memory (PCM). The phase change storage element may be in a crystalline state or in an amorphous state. The state of the phase change storage element is dependent on the value of an input current flowing through the phase change storage element and an active period of the input current. In a situation wherein the input current is great and the active period is short, the phase change storage element is set to the amorphous state and has high impedance. The phase change storage element in the amorphous state is under a reset mode, and the high impedance represents datum '1.' In another situation wherein the input current is low and the active period is long, the phase change storage element may be set to the crystalline state and has low impedance. The phase change storage element in the crystalline state is under a set mode and the low impedance represents datum '0.'

FIG. 1 illustrates the circuit of one bit of a conventional phase change memory, which comprises a current source 102, a phase change storage element PCR, a switch SW, a control module 104 and a comparator comp. The current source 102 provides an input current $I_s$ and is controlled by the control module 104. The control module 104 further controls the state of the switch SW. To store data '1' into the phase change storage element PCR, the control module 104 sets the input current $I_s$ equal to a reset mode current and turns on the switch SW for a reset mode time interval. Thus, the phase change storage element PCR is set to the reset mode and has great impedance representing datum '1.' To store datum '0' into the phase change element PCR, the control module 104 sets the input current $I_s$ equal to a set mode current and turns on the switch SW for a set mode time interval. Thus, the phase change storage element PCR is set to the set mode and has a low impedance represented as datum '0.' To read datum from the phase change storage element PCR, the control module 104 turns on the switch SW and sets the input current $I_s$ equal to a read current. The input current $I_s$ flows through the phase change storage element PCR to generate an output voltage relating to the impedance of the PCR. The output voltage is sent to the comparator comp to be compared with a reference voltage $V_{ref}$. The comparison result is used in determining the datum stored in the phase change storage element PCR. If the output voltage is greater than the reference voltage $V_{ref}$, the phase change storage element PCR has great impedance and the datum stored in the phase change storage element PCR is '1.' If the output voltage is lower than the reference voltage $V_{ref}$, the phase change storage element PCR has low impedance and the datum stored therein is '0'. In the aforementioned description, the read current is far lower than the set mode current, and the set mode current is much lower than the reset mode current. Furthermore, the set mode time interval is longer than the reset mode time interval.

Each bit of a conventional phase change memory, however, has to be individually equipped with a circuit as shown in FIG. 1. Thus, a large circuit board is required and the operating efficiency of the phase change memory is poor. As such, novel phase change memories with a small-sized circuit, good operating efficiency and low power consumption are called for.

BRIEF SUMMARY OF THE INVENTION

The invention provides phase change memories. The phase change memory comprises a current source, a first phase change storage element, a second phase change storage element, a first switch, a second switch and a control module. The current source provides an input current and is coupled to the first phase change storage element. The first phase change storage element is further coupled in series with the second phase change storage element, wherein the first and second phase change storage elements are coupled at a first node. The first switch is coupled to the first node and is operable to provide a first current path to direct the input current to flow through the first phase change storage element when it is turned on. The second switch is coupled in series with the second phase change storage element and is operable to provide a second current path to direct the input current to flow through the first and second phase change storage elements when it is turned on. The first and second switches and the current source are controlled by the control module. Under the control of the control module, an impedance summation of the first and second phase change storage elements varies with the data stored in the first and second phase change storage elements.

The invention further provides control methods of the aforementioned phase change memory. In addition to providing the aforementioned phase change memory, the control method stores datum into the first and second phase change storage elements by controlling the first and second switches and the input current. Under the control method, the impedance summation of the first and second phase change storage elements varies with the data stored in the first and second phase change storage elements.

The above and other advantages will become more apparent with reference to the following description taken in conjunction with the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description shows some embodiments carrying out the invention. This description is made for the purpose of illustrating the general principles of the invention and should not be taken in a limiting sense. The scope of the invention is best determined by reference to the appended claims.

The invention discloses phase change memories comprising a plurality of phase change storage elements that are coupled in series and share a single current source.

Figure 2:
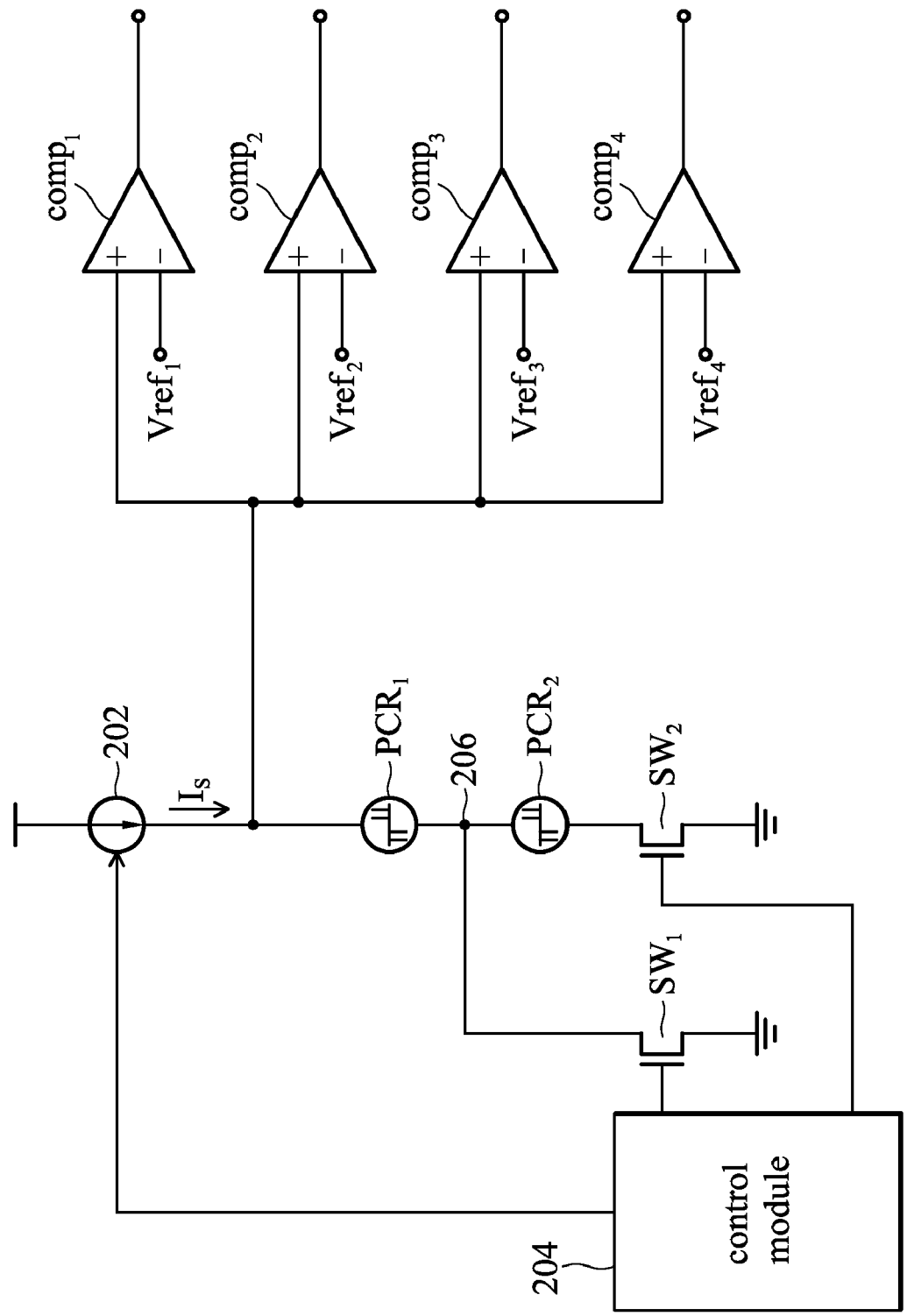
FIG. 2 illustrates an embodiment of the invention.

FIG. 2 illustrates an embodiment of the phase change memory of the invention, which comprises a current source 202, a first phase change storage element $PCR_1$, a second phase change storage element $PCR_2$, a first switch $SW_1$, a second switch $SW_2$ and a control module 204. The current source 202 provides an input current $I_S$ and is coupled to the first phase change storage element $PCR_1$. The second phase change storage element $PCR_2$ is coupled in series with the first phase change storage element $PCR_1$ via a first node 206. The first switch $SW_1$ is coupled to the first node 206. When the first switch $SW_1$ is turned on, a first current path directing the input current $I_S$ to flow through the first phase change storage element $PCR_1$ is provided. The second switch $SW_2$ is coupled in series with the second phase storage element $PCR_2$. When the second switch $SW_2$ is turned on, a second current path directing the input current $I_S$ to flow through both the first and second phase change storage elements $PCR_1$ and $PCR_2$ is provided. The control module 204 controls the states of the first and second switches $SW_1$ and $SW_2$ and sets the value of the input current $I_S$. Under the control of the control module 204, the impedance summation of the first and second phase change storage elements $PCR_1$ and $PCR_2$ varies with the data stored therein.

In the embodiment shown in FIG. 2, the first and second phase change storage elements share a single current source 202, and each stores one bit datum. The data stored in the first and second phase change storage elements $PCR_1$ and $PCR_2$ may be '00', '01', '10' and '11'. The invention sets the first and second phase change storage elements $PCR_1$ and $PCR_2$ to provide different impedance summations for the four data ('00', '01', '10' and '11'). Thus, the data stored in the first and second phase change storage elements $PCR_1$ and $PCR_2$ can be readout by providing a read current to flow therethrough, wherein the control module 204 turns off the first switch $SW_1$ and turns on the second switch $SW_2$, and a voltage difference across two edges of $PCR_1$ and $PCR_2$ is regarded as an output voltage for determining the data stored in the first and second phase change storage elements $PCR_1$ and $PCR_2$.

Referring to FIG. 2, the phase change memory of the invention may further comprise a plurality of comparators $comp_1$-$comp_4$, which compares the output voltage with a plurality of reference voltages $V_{ref1}$-$V_{ref4}$. The comparison results are used in determining the data stored in the first and second phase change storage elements $PCR_1$ and $PCR_2$.

Compared with conventional PCMs having phase change storage elements each corresponding to an individual current source, the invention provides PCMs capable of reading/writing more than one bit by a single current source. The invention dramatically reduces the power consumption and efficiently improves the read rate.

The methods controlling the aforementioned PCMs are disclosed in the following. By controlling the states of the first and second switches $SW_1$ and $SW_2$ and setting the value of the input current $I_S$, the invention sets the impedance summation of the first and second phase change storage elements $PCR_1$ and $PCR_2$ to vary with the data stored therein.

To readout the data stored in the first and second phase change storage elements $PCR_1$ and $PCR_2$, the control method turns off the first switch $SW_1$, turns on the second switch $SW_2$, and sets the input current $I_S$ equal to a read current. Thus, the read current flows through the first and second phase change storage elements $PCR_1$ and $PCR_2$, and a voltage difference across the first and second phase change storage elements $PCR_1$ and $PCR_2$ (named output voltage) is generated. The data stored in the first and second phase change storage elements $PCR_1$ and $PCR_2$ therefore can be determined. In some embodiments. The control method further compares the output voltage with a plurality of reference voltages for determining the data stored in the first and second phase change storage elements $PCR_1$ and $PCR_2$.

Figure 1:
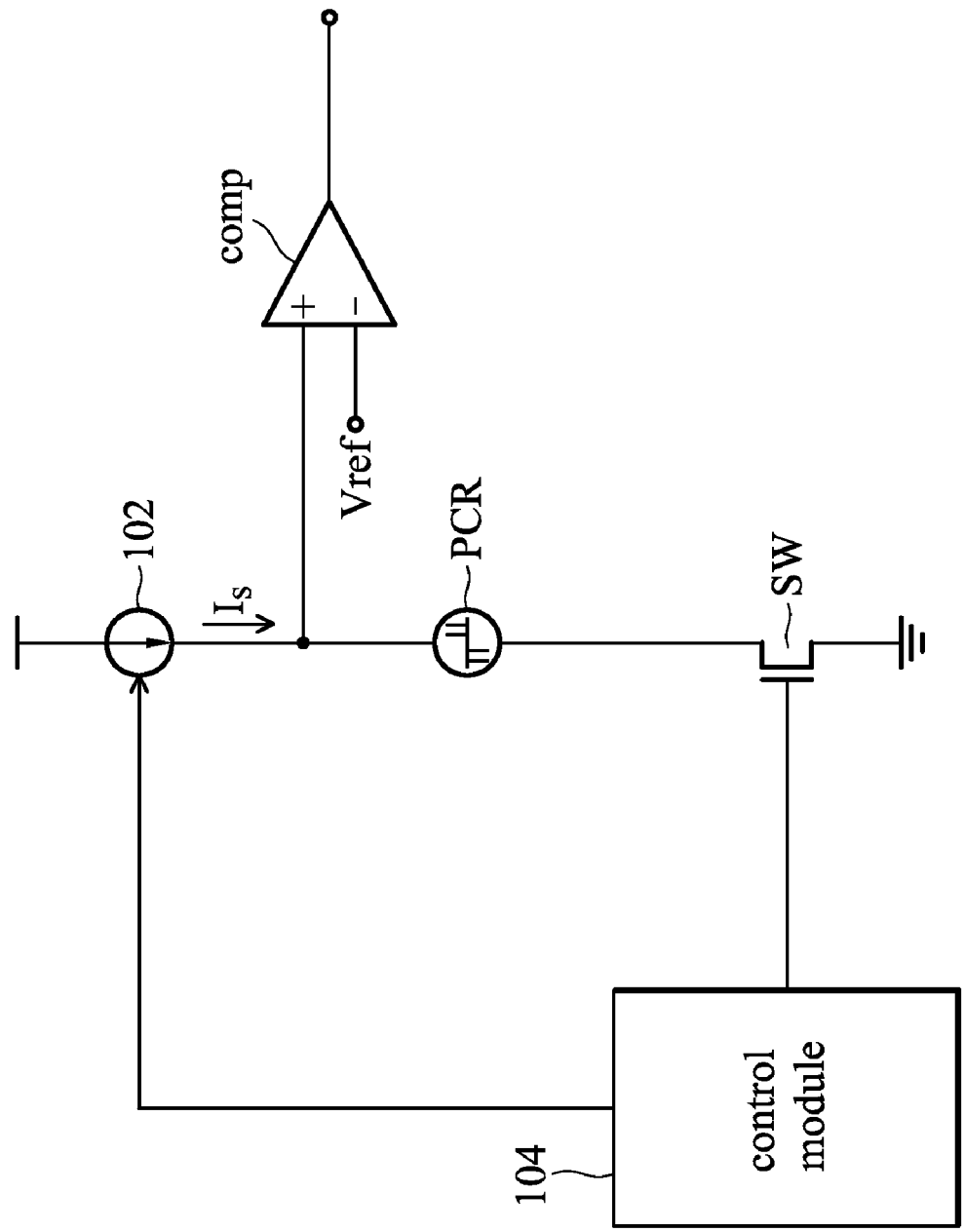
FIG. 1 illustrates the circuit of one bit of a conventional phase change memory.

The invention further discloses methods storing data in the first and second phase change storage elements $PCR_1$ and $PCR_2$. To store the same data in the first and second phase change storage elements $PCR_1$ and $PCR_2$, the control method turns off the first switch $SW_1$ and turns on the second switch $SW_2$. Depending on the value of input current $I_S$ and the active period of the second switch $SW_2$, the first and second phase change storage elements $PCR_1$ and $PCR_2$ are simultaneously set to be of high impedance (representing data '110') or are simultaneously set to be of low impedance (representing data '00'). Compared to the conventional PCM introduced in FIG. 1, the write speed and the total current are halved. In other cases, such as for 'chip erase' which erases stored data '00' or '11' of the first and second phase change storage elements $PCR_1$ and $PCR_2$, the invention halves the erase time and the total erase current.

Figure 3:
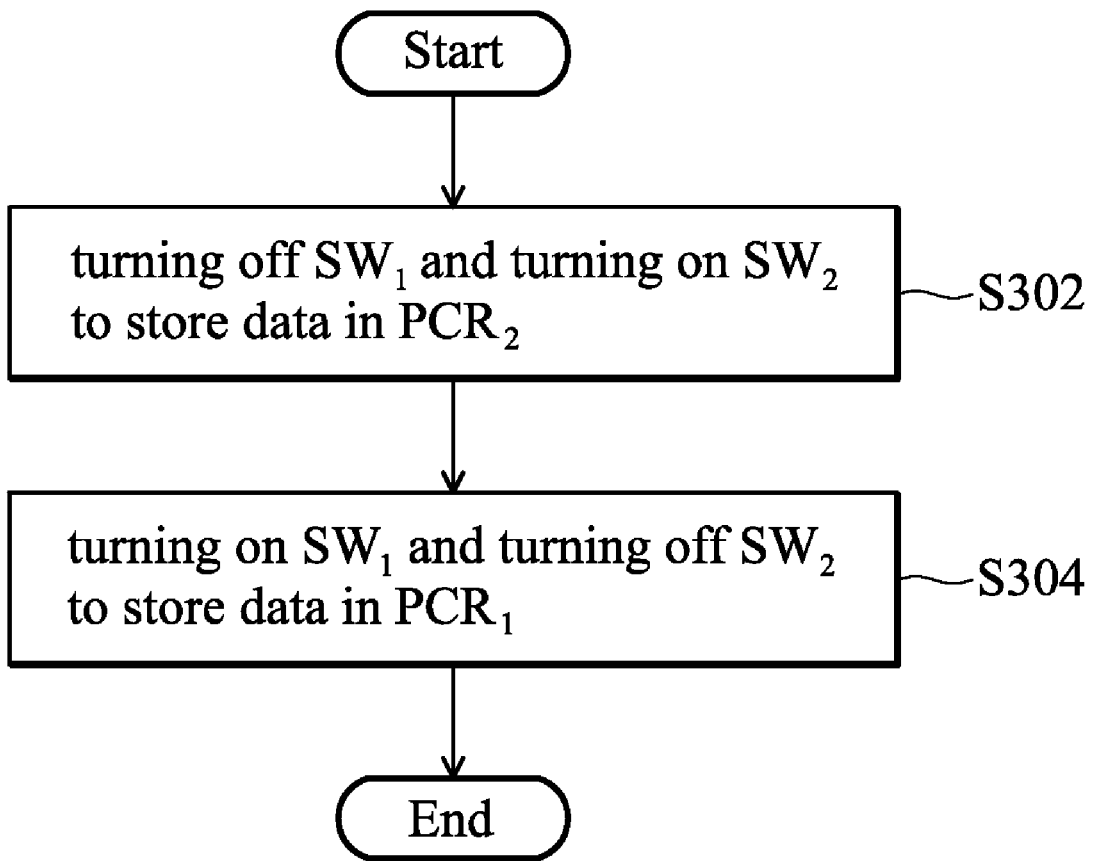
FIG. 3 is a flowchart showing a two-stage writing process of the invention.

To store unequal values in the first and second phase change storage elements $PCR_1$ and $PCR_2$, such as data '01' or data '10', the control method introduces a two-stage writing method, which is illustrated in the flowchart of FIG. 3. In the first stage (S302), the control method turns off the first switch $SW_1$ and turns on the second switch $SW_2$ to set the impedance of the second phase change storage elements $PCR_2$. In the second stage (S304), the control method turns on the first switch $SW_1$ and turns off the second switch $SW_2$ to set the impedance of the first phase change storage element $PCR_1$.

Data '01' and data '10' both comprise a low impedance phase change storage element and a high impedance phase change storage element. To distinguish data '01' and data '10', the control method sets the first and second phase change storage elements $PCR_1$ and $PCR_2$ to have different impedance summation when storing data '01' and data '10'. The invention provides several techniques to achieve this.

In some embodiments, the first and second phase change storage elements $PCR_1$ and $PCR_2$ are designed to have the same manufacture parameters. When driving the same current into the first and second phase change storage elements $PCR_1$ and $PCR_2$ for the same time interval, the impedances of the first and second phase change storage elements $PCR_1$ and $PCR_2$ are the same. Thus, to distinguish data '01' and '10', the control method trims the value of the input current and the active period of the input current. The invention may achieve this by using different set mode time intervals for the first and second phase change storage elements $PCR_1$ and $PCR_2$, or by using different set mode currents for the first and second phase change storage elements $PCR_1$ and $PCR_2$.

This paragraph describes an embodiment of the control method which uses different set mode time intervals for $PCR_1$ and $PCR_2$, wherein the set mode currents, the reset mode currents, and the reset mode time interval for $PCR_1$ and $PCR_2$ are the same (abbreviated as $I_{set}$, $I_{reset}$ and $T_{reset}$, respectively), but the set mode time intervals for $PCR_1$ and $PCR_2$ (abbreviated as $T_{set1}$ and $T_{set2}$, respectively) are unequal, $T_{set1} \neq T_{set2}$. To store data '00' in the first and second phase change storage elements $PCR_1$ and $PCR_2$, the control method sets the input current $I_S$ equal to $I_{set}$, and turns off the first switch $SW_1$ and turns on the second switch $SW_2$ for a time interval of $T_{set2}$ or $T_{set2}$. Thus, the first and second phase change storage elements $PCR_1$ and $PCR_2$ are both set to the set mode to store data '00'. To store data '01' in the first and second phase change storage elements $PCR_1$ and $PCR_2$, the control method sets the input current $I_S$ equal to $I_{reset}$ and enters the first stage S302—turns off the first switch $SW_1$ and turns on the second switch $SW_2$—for a time interval of $T_{reset}$, and then sets the input current $I_S$ equal to $I_{set}$ and enters the second stage S304—turns on the first switch $SW_1$ and turns off the second switch $SW_2$—for a time interval of $T_{set1}$. Thus, the second phase change storage element $PCR_2$ is set to the reset mode in the first stage and the first phase change storage element $PCR_1$ is set to the set mode in the second stage, and the first and second phase change storage elements $PCR_1$ and $PCR_2$ store '0' and '1', respectively. To store data '10' in the first and second phase change storage elements $PCR_1$ and $PCR_2$, the control method sets the input current $I_S$ equal to $I_{set}$ and enters the first stage S302—turns off the first switch $SW_1$ and turns on the second switch $SW_2$—for a time interval of $T_{set2}$, and then sets the input current $I_S$ equal to $I_{reset}$ and enters the second stage S304—turns on the first switch $SW_1$ and turns off the second switch $SW_2$—for a time interval of $T_{reset}$. Thus, the second phase change storage element $PCR_2$ is set to the set mode in the first stage and the first phase change storage element $PCR_1$ is set to the reset mode in the second stage. The first and second phase change storage elements $PCR_1$ and $PCR_2$ store '1' and '0', respectively. To store data '11' in the first and second phase change storage elements $PCR_1$ and $PCR_2$, the control method sets the input current $I_S$ equal to $I_{reset}$ and turns off the first switch $SW_1$ and turns on the second switch $SW_2$ for a time interval of $T_{reset}$. Thus, both the first and second phase change storage elements $PCR_1$ and $PCR_2$ are set to the reset mode to store '11.'

This paragraph describes an embodiment of the control method which uses different set mode currents for the first and second phase change storage elements $PCR_1$ and $PCR_2$, wherein the reset mode currents, the set mode time interval, and the reset mode time interval for the first and second phase change storage elements $PCR_1$ and $PCR_2$ are the same (abbreviated as $I_{reset}$, $T_{set}$, and $T_{reset}$, respectively), but the set mode current for the first and second phase change storage elements $PCR_1$ and $PCR_2$ (abbreviated as $I_{set1}$ and $I_{set2}$, respectively) are unequal, $I_{set1} \neq I_{set2}$. To store data '00' in the first and second phase change storage elements $PCR_1$ and $PCR_2$, the control method sets the input current $I_s$ equal to $I_{set1}$ or $I_{set2}$, and turns off the first switch $SW_1$ and turns on the second switch $SW_2$ for a time interval of $T_{set}$. Thus, the first and second phase change storage elements $PCR_1$ and $PCR_2$ are simultaneously set to the set mode to store data '00'. To store data '01' in the first and second phase change storage elements $PCR_1$ and $PCR_2$, the control method sets the input current $I_s$ equal to $I_{reset}$ and enters the first stage S302—turns off the first switch $SW_1$ and turns on the second switch $SW_2$—for a time interval of $T_{reset}$, and then sets the input current $I_s$ equal to $I_{set1}$ and enters the second stage S304—turns on the first switch $SW_1$ and turns off the second switch $SW_2$—for a time interval of $T_{set}$. Thus, the second phase change storage element $PCR_2$ is set to the reset mode and the first phase change storage element $PCR_1$ is set to its set mode. The first and second phase change storage elements $PCR_1$ and $PCR_2$ store '0' and '1', respectively. To store data '10' in the first and second phase change storage elements $PCR_1$ and $PCR_2$, the control method sets the input current $I_s$ equal to $I_{set2}$ and enters first stage S302—turns off the first switch $SW_1$ and turns on the second switch $SW_2$—for a time interval of $T_{set}$, and then sets the input current $I_s$ equal to $I_{reset}$ and enters the second stage S304—turns on the first switch $SW_1$ and turns off the second switch $SW_2$—for a time interval of $T_{reset}$. Thus, the second phase change storage element $PCR_2$ is set to the set mode set and the first phase change storage element $PCR_1$ is set to the reset mode. The first and second phase change storage elements $PCR_1$ and $PCR_2$ store '1' and '0', respectively. To store data '11' in the first and second phase change storage elements $PCR_1$ and $PCR_2$, the control method sets the input current $I_s$ equal to $I_{reset}$ and turns off the first switch $SW_1$ and turns on the second switch $SW_2$ for a time interval of $T_{reset}$. Thus, both the first and second phase change storage elements $PCR_1$ and $PCR_2$ are set to the reset mode to store '11.'

The invention further discloses other embodiments wherein the first and second phase change storage elements $PCR_1$ and $PCR_2$ are manufactured by different manufacturing parameters. In these embodiments, the first and second phase change storage elements $PCR_1$ and $PCR_2$ are of unequal impedance although they are driven by the same currents for the same time intervals. Thus, it is easy to distinguish data '01' and data '10' and it is not necessary to specially design the input current and its active time interval.

The aforementioned embodiments are not used in limiting the scope of the invention. Any techniques capable of setting the first and second phase change storage elements $PCR_1$ and $PCR_2$ to have different impedance summation are within the scope of the invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A phase change memory, comprising:
   a current source, providing an input current;
   a first phase change storage element, coupled to the current source;
   a second phase change storage element, coupled in series with the first phase change storage element via a first node;
   a first switch, coupled to the first node to provide a first current path directing the input current to flow through the first phase change storage element;
   a second switch, coupled in series with the second phase change storage element to provide a second current path directing the input current to flow through both the first and second phase change storage elements; and
   a control module, controlling the first and second switches and the input current to set an impedance summation of the first and second phase change storage elements to vary with data stored therein.

2. The phase change memory as claimed in claim 1, wherein the control module turns off the first switch, turns on the second switch and sets the input current equal to a read current to produce a voltage difference across the first and second phase change storage elements.

3. The phase change memory as claimed in claim 2, further comprising a plurality of comparators comparing the said voltage difference with a plurality of reference voltages to determine the data stored in the first and second phase change storage elements.

4. The phase change memory as claimed in claim 2, wherein the first and second phase change storage elements have different manufacturing parameters.

5. A method of controlling a phase change memory, comprising:
   providing the phase change memory, comprising:
      a current source, providing an input current;

a first phase change storage element, coupled to the current source;

a second phase change storage element, coupled in series with the first phase change storage element via a first node;

a first switch, coupled to the first node to provide a first current path directing the input current to flow through the first phase change storage element; and a second switch, coupled in series with the second phase change storage element to provide a second current path directing the input current to flow through both the first and second phase change storage elements; and storing data into the first and second phase change storage elements by controlling the first and second switches and the input current, wherein an impedance summation of the first and second phase change storage elements is set to vary with the data stored in the first and second phase change storage elements.

6. The method as claimed in claim 5, further comprising turning off the first switch, turning on the second switch and setting the input current to equal to a read current to produce a voltage difference across the first and second phase change storage elements.

7. The method as claimed in claim 6, further comprising comparing the said voltage difference with a plurality of reference voltages to determine the data stored in the first and second phase change storage elements.

8. The method as claimed in claim 5, wherein the step of storing data further comprises turning off the first switch and turning on the second switch to store the same value in the first and second phase change storage elements.

9. The method as claimed in claim 5, wherein the step of storing data further comprises storing different values in the first and second phase change storage elements by turning off the first switch and turning on the second switch during a first stage, and turning on the first switch and turning off the second switch during a second stage.

10. The method as claimed in claim 5, wherein the step of storing data further comprises setting a set mode time interval of the first phase change storage element to be unequal to that of the first phase change storage element.

11. The method as claimed in claim 5, wherein the step of storing data further comprises setting a set mode current of the first phase change storage element to be unequal to that of the first phase change storage element.

* * * * *